United States Patent
Lukanc

(12)
(10) Patent No.: US 6,291,860 B1
(45) Date of Patent: Sep. 18, 2001

(54) SELF-ALIGNED CONTACTS TO SOURCE/DRAIN SILICON ELECTRODES UTILIZING POLYSILICON AND SILICIDES

(75) Inventor: Todd Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/549,930

(22) Filed: Apr. 14, 2000

Related U.S. Application Data

(62) Division of application No. 09/149,081, filed on Sep. 8, 1998, now Pat. No. 6,096,644.

(51) Int. Cl.$^7$ .................................................. H01L 21/20
(52) U.S. Cl. ........................ 257/382; 257/333; 257/377; 257/389; 257/647; 257/754
(58) Field of Search ................................... 257/288, 333, 257/377, 382, 389, 647, 754

(56) References Cited

U.S. PATENT DOCUMENTS

| | | |
|---|---|---|
| 4,335,502 | 6/1982 | Richman . |
| 4,814,294 | 3/1989 | West et al. . |
| 4,988,632 | 1/1991 | Pfiester . |
| 5,013,676 | 5/1991 | Horigome . |
| 5,130,172 | 7/1992 | Hicks et al. . |
| 5,872,063 * | 2/1999 | Chao et al. ........................ 438/762 |
| 6,072,221 * | 6/2000 | Heida .................................. 257/382 |
| 6,130,102 * | 10/2000 | White, Jr. et al. ..................... 438/3 |
| 6,162,691 * | 12/2000 | Huang .................................. 438/300 |

FOREIGN PATENT DOCUMENTS 11-260904-A * 9/1999 (JP) ................................ H01L/21/76

* cited by examiner

*Primary Examiner*—Eddie Lee
*Assistant Examiner*—Matthew E. Warren

(57) ABSTRACT

Self-aligned contacts to the source and drain regions of a MOS device are formed by selectively removing portions of sidewall spacers from polysilicon source and drain electrodes. Metal silicide layers are then formed in contact with the exposed polysilicon portions and extending over and in contact with respective source and drain regions formed in a semiconductor substrate surface.

4 Claims, 1 Drawing Sheet

SELF-ALIGNED CONTACTS TO SOURCE/DRAIN SILICON ELECTRODES UTILIZING POLYSILICON AND SILICIDES

This application is a Divisional of application Ser. No. 09/149,081 filed Sep. 8, 1998 now U.S. Pat. No. 6,096,644.

FIELD OF THE INVENTION

The present invention relates to a method of manufacturing high-density integrated semiconductor devices exhibiting reliable, adherent, well-aligned contacts to source, drain, and gate electrode regions of active devices such as MOS transistors formed in or on a semiconductor substrate. The invention has particular utility in manufacturing high-density integration semiconductor devices, including multi-level devices, with design rules of 0.18 micron and under.

BACKGROUND OF THE INVENTION

The escalating requirements for high density and performance associated with ultra-large scale integration semiconductor devices necessitate design rules of 0.18 micron and under, increased transistor and circuit speeds, high reliability, and increased manufacturing throughput. The reduction of design features, e.g., of source, drain, and gate regions of transistors formed in or on a common semiconductor substrate, challenges the limitations of conventional contact and interconnection technology, including conventional photolithographic, etching, and deposition techniques.

Recently, there has been a demand for large-scale and ultra small-sized static random access memory (SRAM) devices in high performance complementary metal-oxide-semiconductor (CMOS) microprocessors. Manufacture of such devices require process compatibility with known salicide-CMOS technologies in order to avoid increasing the number of process steps. Conventional methods for reducing cell size include forming local interconnects to couple gates and doped regions. However, technologies utilizing an insulator-capped gate electrode are difficult to adapt for use with a salicide (self-aligned silicide) process, because they require the use of several additional photolithographic masks to etch off the insulator cap in the peripheral areas and to separately dope the gate and source/drain regions. While a damascene type local interconnect process affords some simplification of the fabrication scheme, such processing still requires additional chemical vapor deposition (CVD) of dielectric material, etching, chemical-mechanical planarization (CMP), photolithographic, and metallization steps. Another conventional technique for achieving smaller cell size involves shared-contact technology; however, such methods require contact implantation processing undesirably involving one or more masks in order to avoid junction leakage at the region of the contact on the LDD (lightly doped drain) regions.

Thus, there exists a need for a process for forming self-aligned silicide (i.e., salicide) contacts to transistor source and drain regions without reliance upon either a local interconnect or shared-contact. There exists a further need for methodology enabling the formation of contacts of proper size and alignment that reliably land on the desired areas of the semiconductor substrate and do not short to the gate. Moreover, there exists a need for a process for forming electrical contacts to transistor source and drain regions without shorting into the shallow trench isolation (STI) edge, and provide relatively low resistance local routing and ability to remote the contacts. There is also a need for a process which is compatible with conventional process flow for the manufacture of SRAMS and similar devices employing MOS transistors.

DISCLOSURE OF THE INVENTION

An advantage of the present invention is a method of manufacturing a high density integrated semiconductor device with an improved self-aligned contact structure.

Another advantage of the present invention is a method of forming contacts of proper size and alignment that reliably land on desired source and drain regions of a MOS transistor.

Still another advantage of the present invention is a method for forming contacts to source and drain regions of a MOS transistor which do not short into the edges of isolation regions formed in the semiconductor substrate, provide relatively low resistance local routing, and ability to remote the contacts.

A still further advantage of the present invention is a high-density SRAM or similar type semiconductor device comprising MOS transistors with source and drain regions having self-aligned contacts of proper size and reliable alignment.

Additional advantages, and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

providing a semiconductor wafer having a surface, the semiconductor wafer comprising:

a pair of spaced apart isolation regions formed therein and extending from the wafer surface to a depth below the surface;

a pair of spaced apart source and drain regions formed in the space between the isolation regions;

a patterned, thin gate insulating layer formed on said wafer surface and comprising a portion (a) between said spaced apart source and drain regions and the respective adjacent edge portions of the source and drain regions; and portions (b) on the edge portions of the source and drain regions, opposite to and spaced apart from portions (a) and extending to the periphery of an adjacent one of the pair of isolation regions;

a gate electrode in overlying contact with portion (a) of the gate insulating layer;

source and drain electrodes, each having side surfaces, a top surface and a bottom surface, and each in overlying contact with a respective portion (b) of the gate insulating layer and extending over and in contact with at least a portion of the adjacent isolation region; and insulative sidewall spacers formed on the side surfaces of each of the gate, source, and drain electrodes;

depositing a photoresist layer over the exposed surfaces of the wafer;

patterning the photoresist to form a mask exposing portions of the top surface and sidewall spacers of the source and drain electrodes;

selectively removing the exposed portions of the sidewall spacers, thereby exposing portions of the side edge surfaces of the source and drain electrodes;

forming an electrical conductor in ohmic contact with the exposed top and side surfaces of the source and drain electrodes, the conductor extending over and in ohmic contact with at least a portion of the adjacent source or drain region.

According to another aspect of the present invention, a semiconductor device having improved self-aligned contacts to source and drain regions of the device is provided, comprising:

a semiconductor wafer having a surface, said semiconductor wafer comprising:

a pair of spaced apart isolation regions formed in the wafer surface and extending from the surface to a depth below the surface;

a pair of spaced apart source and drain regions formed in the space between the isolation regions;

a patterned thin gate insulating layer formed on the portion of the wafer surface intermediate the source and drain regions and on portions of the wafer surface intermediate the source and drain regions and their respective adjacent isolation regions;

a gate electrode formed over and in contact with the gate insulating layer intermediate the source and drain regions, with insulative sidewall spacers formed on opposite side surfaces thereof;

source and drain electrodes comprising side surfaces, a top surface, and a bottom surface, formed over respective portions of the source and drain regions, over the portions of the gate insulating layer intermediate the source and drain regions and their respectively adjacent isolation regions, and over at least a portion of the adjacent isolation regions;

insulative sidewall spacers formed on opposite side surfaces of each of the source and drain electrodes; and electrical conductors each in ohmic contact with the top surfaces of respective source and drain electrode and with side surfaces thereof through selectively formed openings in the insulative sidewall spacers and extending down to and over at least a portion of the associated source or drain region.

In embodiments according to the present invention, the semiconductor wafer comprises silicon; the isolation region each comprise a silicon oxide; the thin gate insulating layer comprises a silicon oxide; the gate, source, and drain electrodes each comprise polysilicon; the insulative sidewall spacers each comprise silicon nitride, silicon oxynitride or silicon oxide; and the electrical conductors each comprise a metal silicide. In preferred embodiments, gaps are formed between the wafer surface and bottom surfaces of the source and drain electrodes adjacent the selectively formed openings in the insulative sidewall spacers, the metal silicide is formed by CVD of a metal layer, e.g., a nickel or cobalt layer filling at least a portion of each of the gaps, and reacting the nickel or cobalt layer with the underlying silicon substrate to form an electrically conductive nickel or cobalt silicide.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are capable of modifications in various obvious respects, all without departing from the present invention. Accordingly, the drawing and description are to be regarded as illustrative in nature, and not as limitative.

DESCRIPTION OF THE INVENTION

Figure 1:
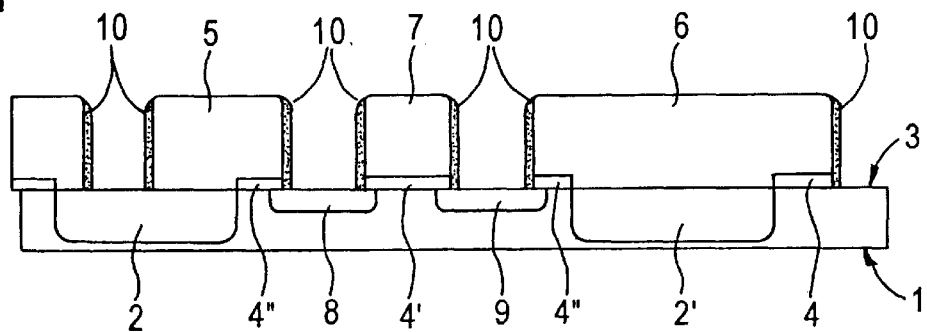
FIGS. 1–4 are simplified, cross-sectional schematic diagrams illustrating process steps for forming self-aligned contacts to the source and drain regions of a MOS transistor, in accordance with an embodiment of the present invention.

Referring to FIG. 1, shown therein, for illustrative purposes, is a portion of a semiconductor wafer substrate 1, typically of monocrystalline silicon of a first conductivity type (p or n), fabricated as a MOS transistor precursor for use in an embodiment of the present invention. Wafer 1 is processed, as by conventional techniques not described here in detail in order to not necessarily obscure the present invention. Wafer 1 comprises a plurality of, illustratively two, shallow trench isolation ("STI") regions 2 and 2' of silicon oxide extending from the substrate surface 3 to a depth below the surface, e.g. about 3000 Å to about 4000 Å. A patterned gate oxide layer 4, typically comprising a silicon oxide and about 22 Å to about 50 Å thick, preferably about 25 Å thick, is formed at preselected locations along the substrate surface 3. Source and drain electrodes 5, 6, typically of polysilicon about 1200 Å to about 2000 Å thick, are formed over at least a portion of isolation regions 2 and 2'. Gate electrode 7, also of polysilicon of similar thickness to the source and drain electrodes, is formed over central segment 4' of gate oxide layer 4 located between the source and drain electrodes 5, 6. Source and drain regions 8, 9, of a second conductivity type opposite that of the substrate 1, are formed, as by ion implantation or diffusion (using polysilicon electrodes 5, 6, and 7 as masks) into each of the regions of the substrate surface 3 between the source, gate, and drain electrodes 5, 7, and 6, respectively. As illustrated, segments 4" of patterned gate oxide layer 4 extend beneath each of the source and drain electrodes 5, 6 from the edge of a respective isolation region 2, 2' over the peripheral edge of an adjacent source or drain region 8, 9. Comprising the MOS transistor precursor structure are insulative sidewall spacers 10, typically of silicon nitride or silicon oxynitride at a thickness of about 200 Å to about 1000 Å thick, formed on the side surfaces of each of the polysilicon electrodes.

Figure 2:
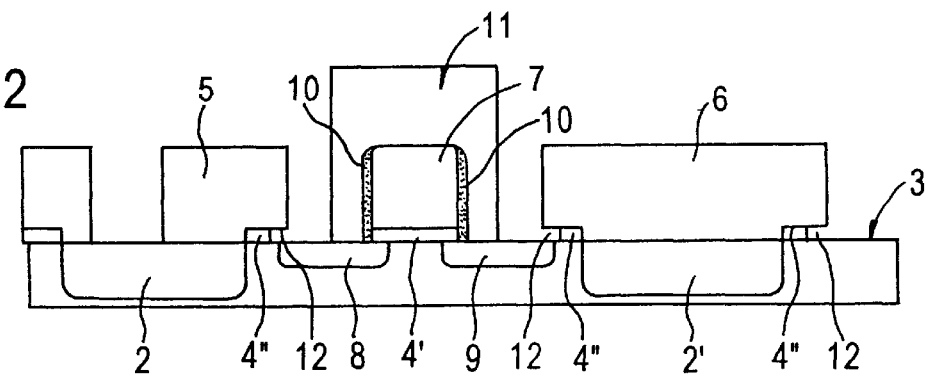

Referring now to FIG. 2, a layer of photoresist 11 is then deposited over the surface of the MOS transistor precursor and patterned, as by conventional masking and etching techniques, to expose portions of sidewall spacers 10 where contact to the polysilicon electrodes is desired. In the illustrated cross-sectional view of FIG. 2, the photoresist layer 11 has been removed from selected portions of both side surfaces of polysilicon source and drain electrodes 5, 6, thereby exposing selected portions of the sidewall spacers 10, and retained at the gate electrode 7, although other arrangements/configurations may be contemplated within the ambit of the present invention. The photoresist was removed prior to the metal deposition process that selectively forms silicides on silicon and poly layers. Still referring to FIG. 2, the exposed sidewall spacer layers 10 are then selectively removed, as by etching. In the case of silicon-based MOS transistor precursors utilizing silicon oxide gate oxide and silicon nitride or silicon oxynitride sidewall spacers, respectively, it was found suitable to isotropically etch using an $SF_6$ reactive plasma etch or a phosphoric acid etch. Silicon oxide sidewall spacers can be isotropically etched in a $CF_4$ reactive plasma etch or buffered oxide wet HF acid etch. Isotropic etching removes portions 12 of the gate oxide segments 4 beneath the side edges of the polysilicon source and drain electrodes 5, 6 and overlying the substrate surface 3, including source and drain regions 8, 9 in addition to the exposed sidewall spacer portions. As a consequence of such oxide undercutting, gaps 12 are formed between the bottom surfaces of the source and drain electrodes 5, 6 and the substrate surface 3, the width of the gaps being equal to the thickness of the removed silicon oxide layer, typically about 25 Å. Gap filling 12 is an additional benefit yielding greater reliability. However, the silicide will form whether or not the gap is etched and/or filled.

Figure 3:
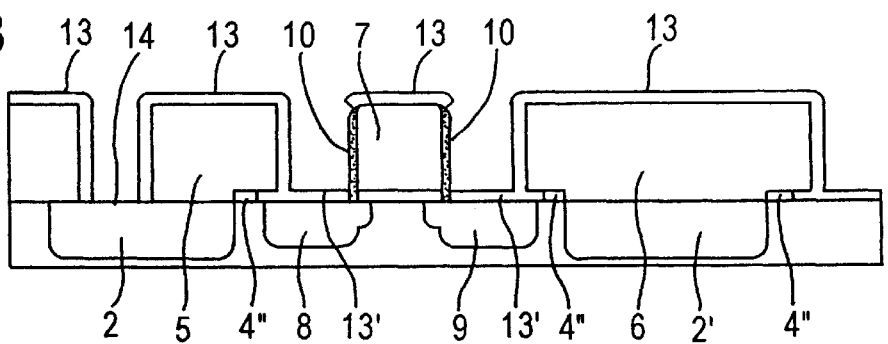

Referring now to FIG. 3, source and drain regions 8, 9 are then subjected to a further ion implantation and rapid thermal annealing steps, as is conventional, in order to form heavily doped ($n^+$ or $p^+$) contact regions at the upper surfaces thereof. In the next step, a metal layer, such as cobalt, nickel, or titanium, is deposited over all exposed surfaces and filling at least portions of the gaps 12 present at the bottom surfaces of polysilicon source and drain electrodes 5, 6 and the underlying peripheral surface portions of the source and drain regions 8, 9. After removal of the photoresist layer 11, the thus-deposited metal layer is then converted, as by a rapid thermal annealing process (RTA), into an electrically conductive metal silicide layer 13 which forms on all polysilicon surfaces, including those surfaces exposed by the previous selective removal of the silicon nitride insulative sidewall spacer layer 10 and in the gaps 12 above the source and drain regions 8, 9. Metal silicide layer 13 does not form over the silicon nitride sidewall spacer layers on the side surfaces of the polysilicon gate electrode 7 and on exposed silicon oxide surfaces, such as surface 14 of isolation region 2. The formation of metal silicide layer 13 in the gaps 12 according to embodiments of the method of the present invention is technologically advantageous in reliably providing continuity of electrical conduction between the metal silicide layer 13 on the top and side edge surfaces of the polysilicon source and drain electrodes 5, 6 and the portions 13' thereof overlying the source and drain regions 8, 9, because this constitutes the full current path to the active device. Thus, the initially deposited metal layer should have good surface coverage in the gaps 12 and the metal silicide form completely across the about 25 Å thickness dimension of the gaps. While cathode sputtering can, in some instances, provide such surface coverage, it is somewhat limited in this respect due to the essential "line-of-sight" nature of the sputtering process. A more preferred technique for achieving good coverage of obscured surfaces, such as the internal surfaces of voids or gaps 12, is chemical vapor deposition (CVD) employing a gaseous inorganic or organic (i.e., organometallic) compound or derivative of the metal to be deposited. A suitable process for CVD of nickel, cobalt, or titanium metal films useful in the method of the present invention and which is capable of deposition in "nooks and crannies" of a substrate is disclosed in, for example, U.S. Pat. No. 5,130,172, the entire disclosure of which is incorporated herein by reference. Alternatively, low resistance metal silicide films, e.g., of cobalt silicide, may be directly deposited, with good surface coverage of voids and gaps, in a single step CVD process utilizing a mixture of vapors of cobalt containing and silicon containing precursors, as disclosed in e.g., U.S. Pat. No. 4,814,294, the entire disclosure of which is incorporated herein by reference. The latter alternative advantageously eliminates the rapid thermal annealing step required according to the former alternative, which typically involves heating at a temperature of from about 500° C. to about 850° C. for about 10 seconds to about 30 seconds preferably in an inert atmosphere to convert deposited cobalt or nickel to a silicide by solid-state reaction.

Figure 4:
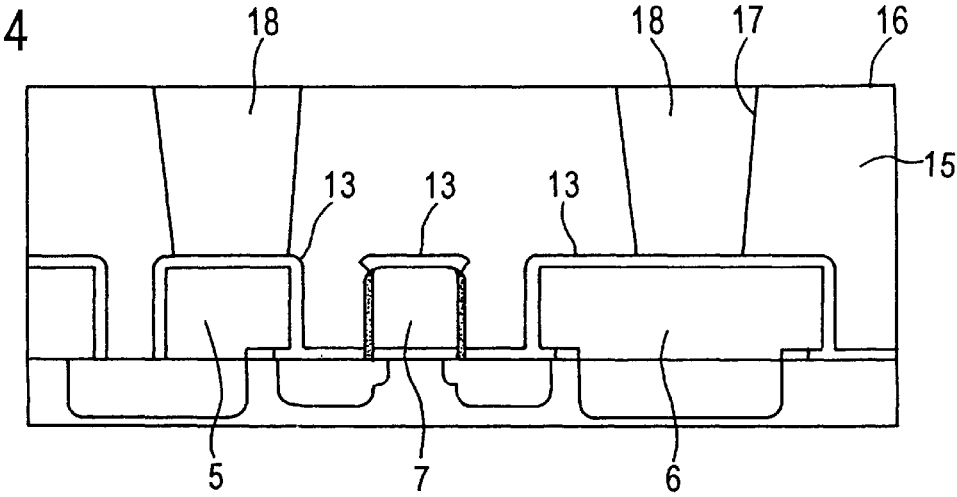

Referring now to FIG. 4, an interlayer dielectric (ILD) 15, is then formed, in conventional manner, over the thus-developed structure and planarized at its upper surface 16, as by etching or chemical-mechanical polishing (CMP) techniques. Via openings 17 are formed in the ILD 15 in at least partial vertical registry with metal silicide layer segments 13 formed on the top surfaces of the polysilicon source, drain, and gate electrodes 5, 6, and 7 filled with an electrically conductive plug of e.g., tungsten, thus constituting a first metallization level. Further processing proceeds in a conventional manner to form additional metallization levels separated by respective interlayer dielectric layers.

Thus, the present invention provides several technological advantages over existing methodology, including, but not limited to, formation of self-aligned source and drain contacts, which contacts do not have any issues or problems associated with proximity to the shallow trench isolation regions. The inventive method also enables formation of buried contacts with a simple local interconnect scheme. Advantageously, all contacts are of substantially the same depth, and there is an acceptable misalignment margin for contacts falling off the polysilicon before they adversely impact device properties.

In the previous descriptions, numerous specific details are set forth, such as particular materials, structures, reactants, processes, etc., in order to provide a thorough understanding of the present invention. However, it should be recognized that the present invention can be practiced without resorting to the details specifically set forth. In other instances, well-known processing structures and techniques have not been described in detail in order not to unnecessarily obscure the present invention.

Only the preferred embodiments of the present invention are shown and described herein. It is to be understood that the invention is capable of changes or modifications within the scope of the inventive concept as expressed herein.

What is claimed is:

1. A semiconductor device, comprising:
    a semiconductor wafer having a surface, said semiconductor wafer comprising:
        a pair of spaced apart isolation regions formed in said wafer surface and extending from said surface to a depth below said surface;
        a pair of spaced apart source and drain regions formed in the space between said isolation regions;
        a patterned thin gate insulating layer formed on the portion of said wafer surface intermediate said source and drain regions and on portions of said wafer surface intermediate the source and drain regions and their respective adjacent isolation regions;
        a gate electrode formed over and in contact with said gate insulating layer intermediate said source and drain regions, with insulative sidewall spacers formed on opposite side surfaces thereof;
        source and drain electrodes each comprising side surfaces, a top surface, and a bottom surface, formed over respective portions of said source and drain regions, over said portions of the gate insulating layer intermediate the source and drain regions and their respective adjacent isolation regions, and over at least a portion of the adjacent isolation regions;
        insulative sidewall spacers formed on opposite side surfaces of each of said source and drain electrodes; and
        electrical conductors each in ohmic contact with the top surfaces of respective source and drain electrodes and with said surfaces thereof through selectively formed openings in said insulative sidewall spacers, and extending down to and over at least a portion of the associated source or drain region.

2. The semiconductor device as in claim 1, wherein:

said semiconductor wafer comprises silicon;

said isolation regions each comprise a silicon oxide;

said thin gate insulating layer comprises a silicon oxide; and said gate, said source, and said drain electrodes each comprise polysilicon; and said insulative sidewall spacers each comprise silicon nitride.

3. The semiconductor device as in claim 2, wherein said electrical conductors each comprise a metal silicide.

4. The semiconductor device as in claim 3, further comprising gaps defined between bottom surfaces of each of said source and drain electrodes and underlying portions of said source and drain regions, said electrical conductors filling at least a part of each gap.

* * * * *